United States Patent
Chi et al.

(10) Patent No.: US 7,187,163 B2
(45) Date of Patent: Mar. 6, 2007

(54) PARAMETRIC MEASURING CIRCUIT FOR MINIMIZING OSCILLATION EFFECT

(75) Inventors: Shyh-An Chi, Hsinchu (TW);
Wang-Chin Chen, Kaohsiung County (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/905,735

(22) Filed: Jan. 19, 2005

(65) Prior Publication Data
US 2006/0158178 A1    Jul. 20, 2006

(51) Int. Cl.
*G01R 31/28* (2006.01)
*G01R 31/26* (2006.01)

(52) U.S. Cl. .................... 324/158.1; 324/765

(58) Field of Classification Search .................... None
See application file for complete search history.

(56) References Cited

U.S. PATENT DOCUMENTS 6,535,013 B2 *  3/2003  Samaan .................. 324/765

* cited by examiner

*Primary Examiner*—Paresh Patel
*Assistant Examiner*—Roberto Velez
(74) *Attorney, Agent, or Firm*—Winston Hsu

(57) ABSTRACT

A parametric measuring circuit for minimizing an oscillation effect is provided. The parametric measuring circuit comprises an input detection circuit, an oscillation effect eliminating logic circuit and an output selection circuit. The input detection circuit receives an input signal from an external input terminal and outputs the detection signal. The oscillation effect eliminating logic circuit is coupled to the input detection circuit for reducing/eliminating oscillation effect and outputting the detection signal. The output selection circuit is coupled to the oscillation effect eliminating logic circuit to select and transmit either the output signal generated from the internal circuit or the detection signal to the output terminal.

7 Claims, 5 Drawing Sheets

PARAMETRIC MEASURING CIRCUIT FOR MINIMIZING OSCILLATION EFFECT

BACKGROUND OF THE INVENTION

1. Field of the Invention

The present invention relates to a parametric measuring circuit, and more particularly to a parametric measuring circuit for minimizing oscillation effect.

2. Description of the Related Art

Oscillation effect is usually confronted during parametric measurements at input/output ports of integrated circuits. Among known parametric measuring circuits, one of the widely used circuits is the parametric measuring circuit with a NAND tree structure. A NAND tree can be used to measure input signal levels VIL and VIH. The input signal is the external signal received by the input port. The output terminal of the NAND tree and the output terminal of the internal circuit are coupled to multiplexers to form a complete measuring circuit.

FIG. 1a is a conventional parametric measuring circuit with a NAND tree structure. Referring to FIG. 1a, the conventional parametric measuring circuit comprises an input detection circuit 110 and an output selection circuit 120. The external input signal is transmitted to the integrated circuit through the input terminal 130. The input detection circuit 110 of the parametric measuring circuit receives the input signal levels VIL and VIH, and generates the output detection signal 113 to the output selection circuit 120. The input detection circuit 110 is composed of plural NAND gates 111 and 112. The NAND gates are coupled to each other in a tree structure. The last stage NAND gate 112 of the tree structure outputs the detection signal 113. The output selection circuit 120 is composed of plural multiplexers 121–124. Each of these multiplexers 121–124 is coupled between the internal circuit 100 and a corresponding output terminal, and coupled to the input detection signal 113 generated by the input detection circuit 110. An operation mode control signal 125 is applied to the multiplexer 121–124 for the parametric measuring circuit to operate under a normal operation mode or a measuring mode.

When the integrated circuit operates under a normal operational mode, the multiplexers 122 and 124 of the output selection circuit 120 select and transmit the output signals 101 and 102 generated from the internal circuit 100 to the input terminals of the buffers 141 and 142, respectively. Meanwhile, the multiplexers 121 and 123 select and transmit the output control signals 101c and 102c generated from the internal circuit 100 to the output enable terminals of the buffers 141 and 142, respectively. Under the normal operational mode, the integrated circuit receives and transmits signals through the input terminal 130 and the output terminal 150, respectively.

In order to measure the input signal levels VIL and VIH, and the output signal levels VOL and VOH of the integrated circuit, the integrated circuit should operate under a measuring mode. In the measuring mode, the multiplexers 122 and 124 of the output selection circuit 120 select and transmit the detection signal 113 to the input terminals of the buffers 141 and 142, respectively. Meanwhile, the multiplexers 121 and 123 select and transmit the control signal C, such as logic "1," to the output enable terminals of the buffers 141 and 142, respectively. By adjusting the input voltage of the input terminal 130 and measuring an output voltage of one of the output terminals 150, the input signal levels VIL and VIH and the output signal levels VOL and VOH can be obtained.

When oscillation effect occurs on the parameter measurement, a precise voltage value cannot be measured. For a clear explanation, a block diagram in FIG. 1b represents the circuit in FIG. 1a.

FIG. 1b is a block diagram of FIG. 1a in a measuring mode. Referring to FIG. 1b, the input circuit 160 represents the input buffers and the input detection circuit 110 in FIG. 1a. The output circuit 170 represents the output buffers and output selection circuit 120 in FIG. 1a. In addition, the voltage-adjustment symbol 180 represents the adjusted input voltage 161 provided in the measuring mode. Under the measuring mode, the input circuit 160 receives the input voltage 161 and outputs the detection signal 162. The output circuit 170 receives and outputs the detection signal 162 generated from the input circuit 160. For a normally operated measuring circuit, the low input voltage level VIL and the high input voltage level VIH can be precisely measured. In the measuring circuit described above, however, after the input terminal of the input circuit 160 receives the input signal, if interrupted by noises in the circuits, feedback routes 171 and 172 between the input circuit 160 and the output circuit 170 are formed due to the power source line VCC and the ground line GND coupled thereto. As a result, oscillation effect occurs between the input circuit 160 and the output circuit 170. The output signal generated from the output circuit 170 thus carries the oscillation effect and is transmitted back to the input circuit 160 through the feedback routes 171 and 172, resulting in inaccurate parameter measurements.

Accordingly, how to avoid oscillation effect created by noises and to enhance the parameter measurement accuracy in the measuring circuit becomes an imperative task to be dealt with.

SUMMARY OF THE INVENTION

Accordingly, the present invention is directed to a parametric measuring circuit for minimizing an oscillation effect, used to measure characteristics at plural input and output terminals of an integrated circuit. When oscillation effect occurs on the parametric measuring circuit, only some of the output terminals, such as only one output terminal, output the detection signal, thereby reducing the oscillation effect.

The present invention is also directed to a parametric measuring circuit for minimizing an oscillation effect, used to measure characteristics at plural input and output terminals of an integrated circuit. When oscillation effect occurs on the parametric measuring circuit, the oscillation effect can be removed and the detection signal is thus outputted.

The present invention provides a parametric measuring circuit for minimizing an oscillation effect, used to measure characteristics at plural input and output terminals of an integrated circuit. The parametric measuring circuit comprises a control circuit, an input detection circuit and an output selection circuit. The control circuit outputs a control signal according to an oscillation effect. The input detection circuit is coupled to the input terminals and receives input signals therefrom in order to output detection signals. The output selection circuit selects and transmits either the output signal from the internal circuit or the detection signal to the corresponding output terminals according to the control signal. Wherein, under a normal operational mode, the output selection circuit selects and transmits the output signal from the internal circuit to the corresponding output terminals according to the control signal, and under a measuring mode, the output selection circuit selects and transmits the detection signal to some of the output terminals according to the control signal. For example, under the measuring mode, the output selection circuit selects to enable only one output buffer so that the detection signal can only be measured by an output terminal.

The present invention also provides a parametric measuring circuit for minimizing an oscillation effect, used to measure characteristics on plural input and output terminals of an integrated circuit. The parametric measuring circuit comprises an input detection circuit, an eliminating logic circuit and an output selection circuit. The input detection circuit is coupled to the input terminals and receives input signals therefrom in order to output detection signals. The eliminating logic circuit is coupled to the input detection circuit and receives the detection signal in order to remove the oscillation effect and output the detection signal. The output selection circuit is coupled between an internal circuit of the integrated circuit and the output terminals, and coupled to the eliminating logic circuit, selecting and transmitting either the output signal from the internal circuit or the detection signal to the output terminals.

According to an embodiment of the present invention, the eliminating logic circuit of the parametric measuring circuit for minimizing an oscillation effect described above comprises a flip flop coupled between the input detection circuit and the output selection circuit.

The output reducing/eliminating logic circuit is coupled between the input detection circuit and the output selection circuit of the parametric measuring circuit according to the present invention. Accordingly, when noises occur which lead to an oscillation effect between the input detection circuit and the output selection circuit, and the output signal outputted from the output selection circuit carries the oscillation effect and is fed back to the input detection circuit, the output reducing circuit is able to confine the noises in a small range or the eliminating logic circuit is able to remove the noises. Therefore, the more precise low input voltage level VIL and high input voltage level VIH can be measured.

The above and other features of the present invention will be better understood from the following detailed description of the embodiments of the invention that is provided in communication with the accompanying drawings.

DESCRIPTION OF SOME EMBODIMENTS

Figure 1A:
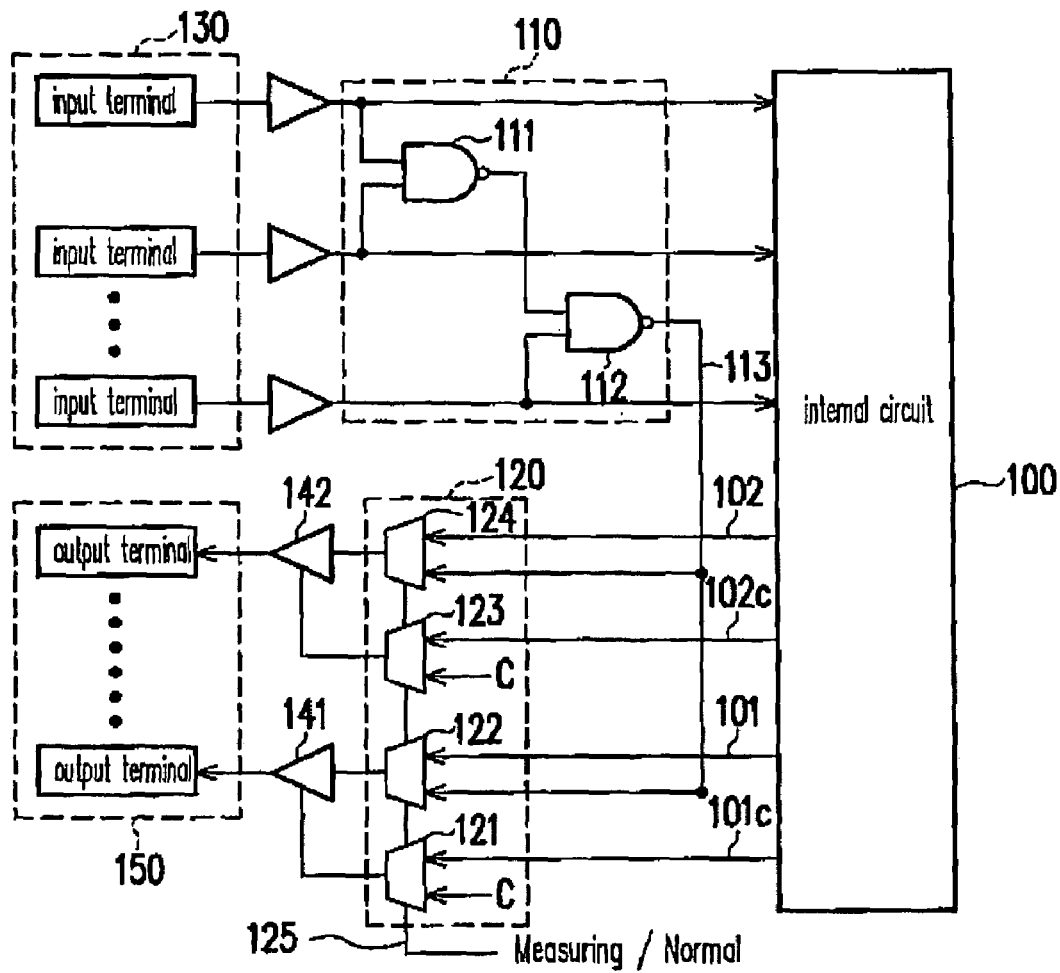
FIG. 1a is a conventional parametric measuring circuit with a NAND tree structure.
Figure 1B:
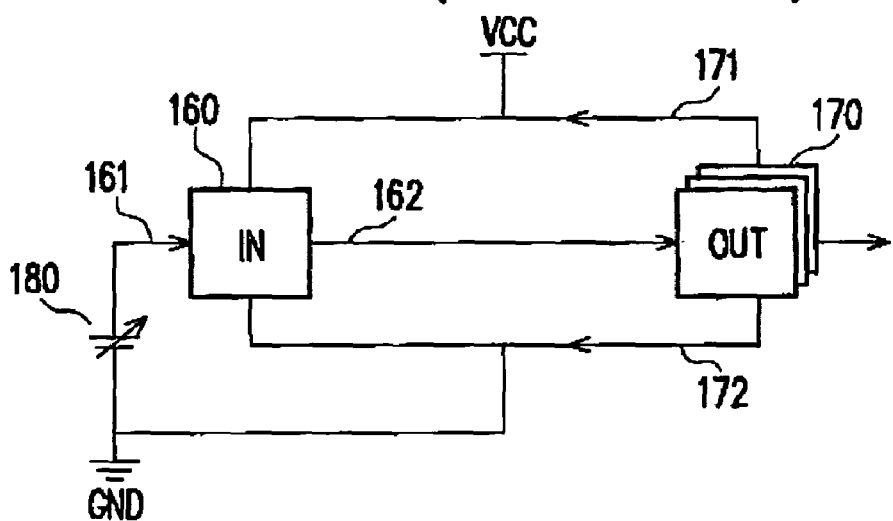
FIG. 1b is a block diagram of FIG. 1a under a measuring mode.
Figure 2:
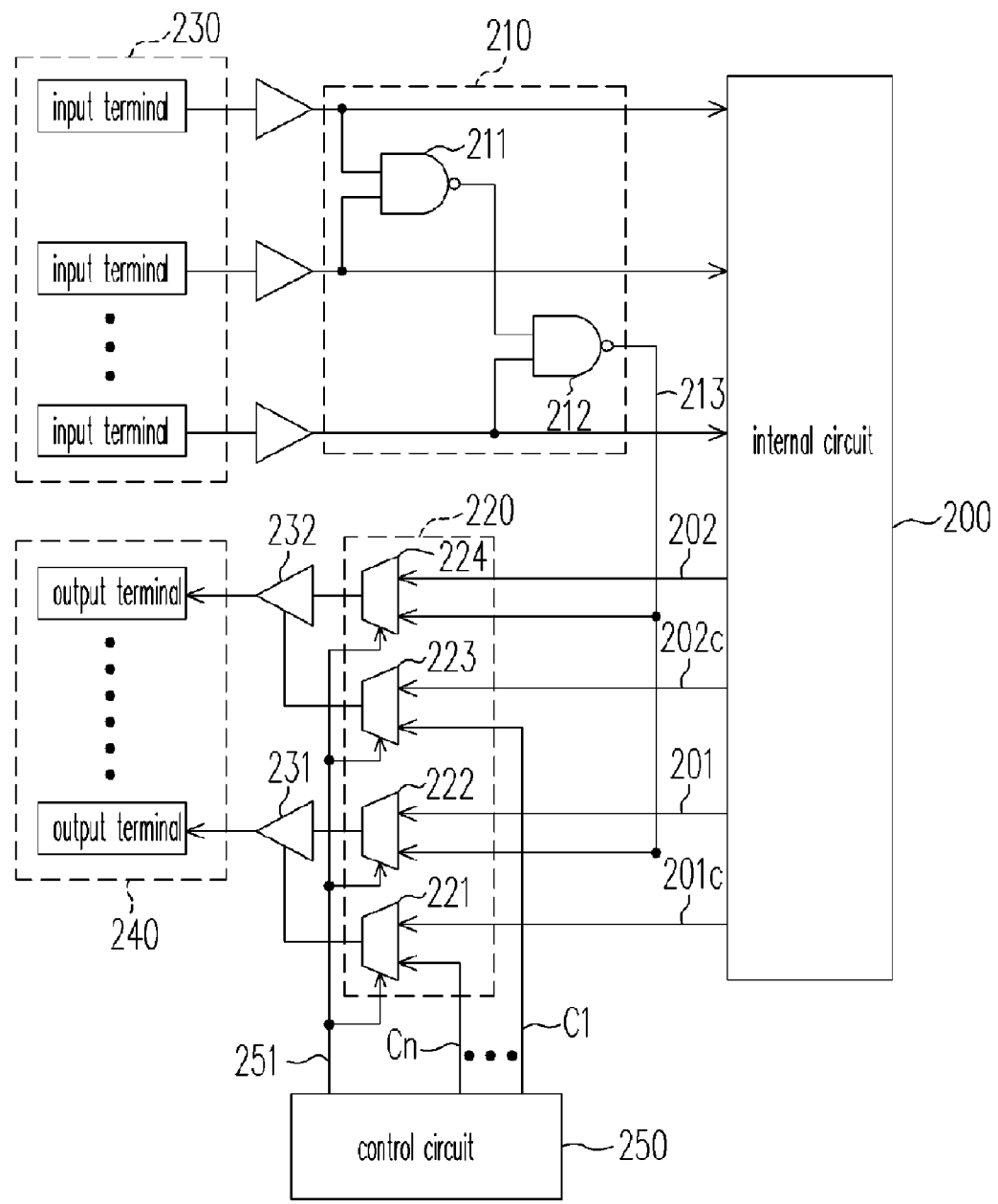
FIG. 2 is a schematic drawing showing a parametric measuring circuit for minimizing an oscillation effect according to an embodiment of the present invention, in which the logic gates are NOR gates.
Figure 2A:
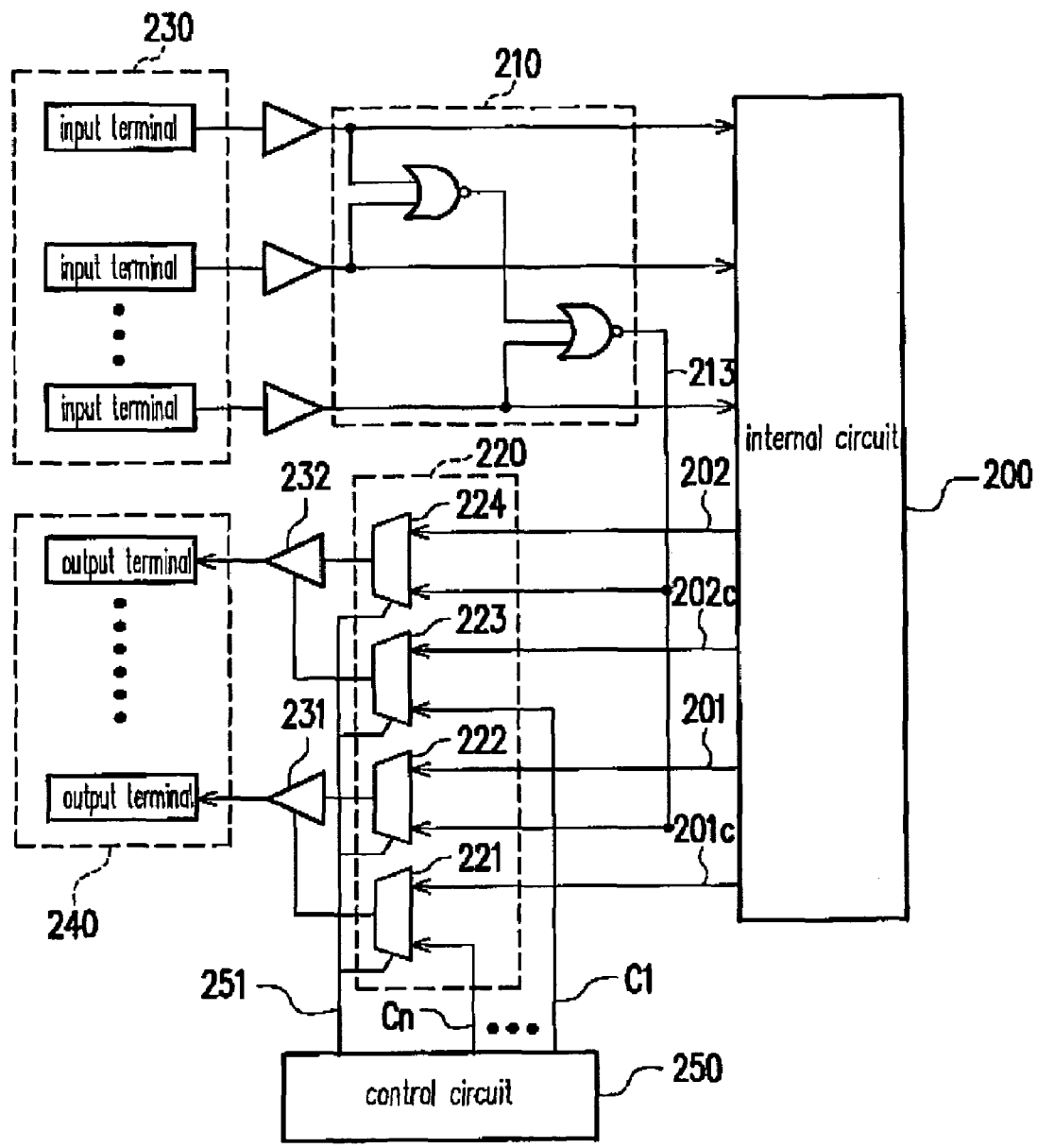
FIG. 2A is a schematic drawing showing a parametric measuring circuit for minimizing an oscillation effect according to another embodiment of the present invention, in which the logic gates are NOR gates.

FIG. 2 is a schematic drawing showing a parametric measuring circuit for minimizing an oscillation effect according to an embodiment of the present invention. Referring to FIG. 2, the parametric measuring circuit in this embodiment comprises an input detection circuit 210, an output selection circuit 220 and a control circuit 250. Wherein, the input detection circuit 210 of this embodiment is composed of plural logic gates. In the embodiment, the logic gates are NAND gates 211 and 212, as shown in FIG. 2 for example. The input detection circuit 210, however, is not limited to be composed of plural NAND gates such as gates 211 and 212. These NAND gates 211 and 212 are coupled to each other in a tree structure, and coupled to the next-stage input terminal. The last stage of the NAND gate 212 of the tree structure outputs the detection signal 213. In another embodiment, as shown in FIG. 2A, the logic gates can be replaced with NOR gates, for example.

The output selection circuit 220 of this embodiment is composed of plural multiplexers such as multiplexers 221–224. The output selection circuit 220, however, is not limited to be composed of these multiplexers 221–224. Each of these multiplexers 221–224 is coupled to a corresponding output terminal of the internal circuit 200 and coupled to the input detection circuit 210. Each of these multiplexers 221–224 selects either the output signal from the internal circuit or the detection signal 213.

When the integrated circuit operates under a normal operational mode, the control circuit 250 outputs the control signal 251 so that the multiplexers 222 and 224 of the output selection circuit 220 select and transmit the output signals 201 and 202 from the internal circuit 200 to the input terminals of the output buffers 231 and 232, respectively. Meanwhile, the multiplexers 221 and 223 select and transmit the output control signals 201c and 202c generated from the internal circuit 200 to the output enable terminals of the buffers 231 and 232, respectively. Under the normal operational mode, the integrated circuit receives and transmits signals through the input terminal 230 and the output terminal 240, respectively.

In order to measure the input signal voltage levels VIL and VIH of the integrated circuit, the integrated circuit should enter a measuring mode. Under the measuring mode, control circuit 250 outputs the control signal 251 so that the multiplexers 222 and 224 of the output selection circuit 220 select and transmit the detection signal 213 to the input terminals of the buffers 231 and 232, respectively. Meanwhile, the multiplexers 221 and 223 select and transmit the control signals C1–Cn outputted from the control circuit 250 to the output enable terminals of the buffers 231 and 232, respectively, such that only some of the buffers are enabled, and the others are disabled. Wherein, the number of the buffers enabled depends on the oscillation effect. The more serious the oscillation effect, the fewer buffers are enabled. For example, only one buffer 231 is enabled and the others are disabled. Under this situation, by adjusting the input voltage of the input terminal 230 and measuring an output voltage of one of the output terminals 240 can the input signal voltage levels VIL and VIH be obtained.

Figure 3:
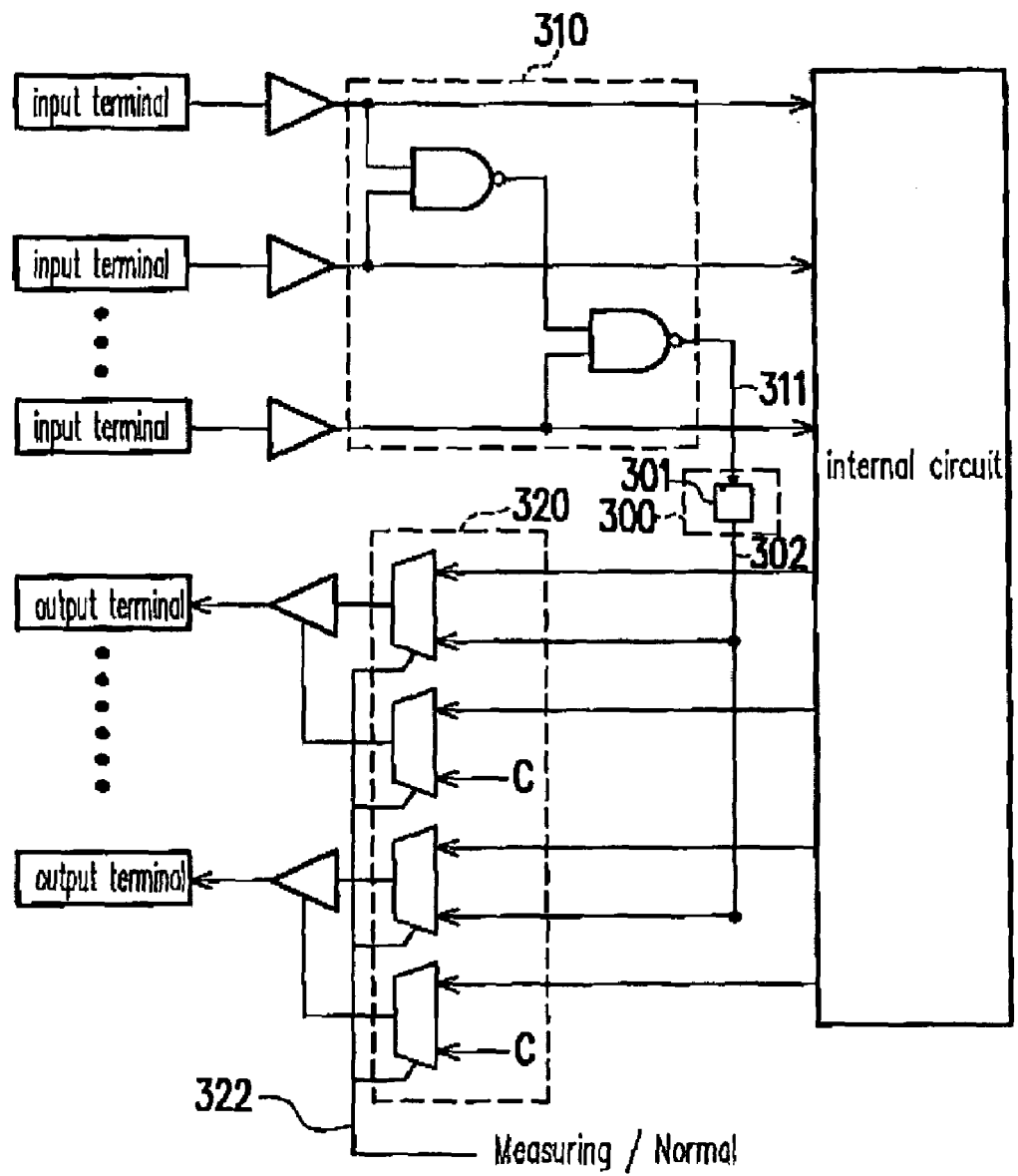
FIG. 3 is a schematic drawing showing a parametric measuring circuit using an eliminating logic circuit for minimizing an oscillation effect according to a further embodiment of the present invention.

FIG. 3 is a schematic drawing showing a parametric measuring circuit using an eliminating logic circuit for minimizing an oscillation effect according to another embodiment of the present invention. Referring to FIG. 3, the parametric measuring circuit in this embodiment comprises an input detection circuit 310, an eliminating logic circuit 300 and an output selection circuit 320. The circuit in FIG. 3 is similar to that in FIG. 2. The detailed descriptions of similar items are not repeated. A measuring/normal control signal 322 is applied to the output selection circuit 320 for the measuring or normal operation, like the signal 251 shown in FIG. 2. The difference in FIG. 3 is that the eliminating logic circuit 300 is disposed between the input detection circuit 310 and the output selection circuit 320.

In this embodiment, the eliminating logic circuit 300 is a flip-flop 301. The input terminal of the flip-flop 301 is coupled to the input detection circuit 310, and the output terminal of the flip-flop 301 is coupled to the output selection circuit 320. The eliminating logic circuit 300 receives the detection signal 311 to latch the detection signal 311 according to a preset timeing, and outputs an eliminating logic signal 302. Accordingly, the signal route through which oscillation effect occurs can be efficiently blocked and the oscillation effect can be substantially suppressed. Therefore, the input low voltage level VIL and the input high voltage level VIH can be precisely measured. In this embodiment, the eliminating logic circuit 300 blocks the feedback route for oscillation effect and thus substantially suppresses oscillation effect. Accordingly, all of these output terminals can be enabled by using the same control signal C. In other words, the output terminals of the integrated circuit can simultaneously output the eliminating logic signals 302 without generating oscillation effect. For a clear explanation, this embodiment in FIG. 3 is simplified in FIG. 4.

Figure 4:
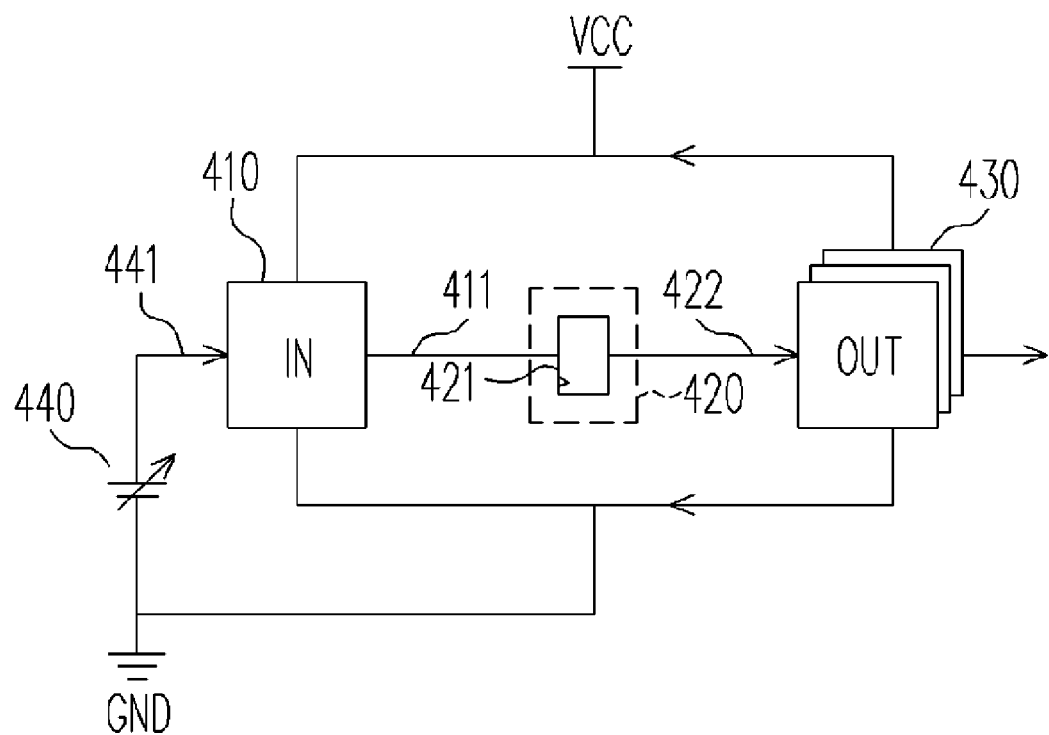
FIG. 4 is a block diagram of the circuit in FIG. 3 under a measuring mode.

FIG. 4 is a block diagram of FIG. 3 under a measuring mode. Referring to FIG. 4, the input circuit 410 represents the input buffers and input detection circuit 310 in FIG. 3. The output circuit 430 represents the output buffers and the output selection circuit 320 in FIG. 3. In addition, the voltage-adjustment symbol 440 represents the adjusted input voltage 441 under the measuring mode. The eliminating logic circuit 420, which represents the eliminating logic circuit 300 in FIG. 3, is flip-flop 421 according to an embodiment of the present invention.

Under a measuring mode, the input circuit 410 is coupled to and receives the external input signal 441 to output the detection signal 411. The eliminating logic circuit 420 is coupled to the input circuit 410 and latches the detection signal 411 according to a preset timing to block the route on which the oscillation effect occurs and outputs the eliminating logic signal 422. The output circuit 430 is coupled to the eliminating logic circuit 420 to output a detection result. As described above, the eliminating logic circuit is able to minimize the oscillation effect in a parametric measuring circuit and therefore, more precise input low voltage level VIL and input high voltage level VIH can be measured.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A parametric measuring circuit for minimizing an oscillation effect, used to measure characteristics of plural input and output terminals of an integrated circuit, the parametric measuring circuit comprising:

an input detection circuit, coupled to the input terminals and receiving input signals therefrom to output a detection signal; and an output selection circuit, coupled between an internal circuit and the output terminals of the integrated circuit, and coupled to the input detection circuit, selecting and transmitting either the output signal from the internal circuit or the detection signal to the output terminals according to the control signal; and a control circuit, outputting a plurality of control signals under a measuring mode according to an oscillation effect, wherein some of the control signals are adapted for enabling the output terminals, and the other control signals are adapted for disabling the output terminals;

wherein under a normal operational mode, the output selection circuit selects and transmits the output signal from the internal circuit to the corresponding output terminals according to the control signals, and under a measuring mode, the output selection circuit selects and transmits the detection signal to some of the output terminals according to the control signals.

2. The parametric measuring circuit of claim 1, wherein when under the measuring mode, the output selection circuit selects and transmits the detection signal to one of the output terminals according to the control signals.

3. The parametric measuring circuit of claim 1, wherein the input detection circuit comprises a plurality of logic gates, the logic gates coupled to each other and to the input terminals, and a last output terminal of a last-stage logic gate of the logic gates outputs the detection signal.

4. The parametric measuring circuit of claim 3, wherein the logic gates are NAND gates.

5. The parametric measuring circuit of claim 3, wherein the logic gates are NOR gates.

6. The parametric measuring circuit for minimizing an oscillation effect of claim 1, wherein the output selection circuit comprises a plurality of multiplexers, each of the multiplexers coupled between the internal circuit and one of the corresponding output terminals, and each of the multiplexers selects and transmits either the output signal from the internal circuit or the detection signal to one of the output terminals corresponding thereto according to the control signals.

7. The parametric measuring circuit of claim 6, wherein the control circuit controls the output terminals to determine whether to enable the output terminals.

* * * * *